United States Patent
Deguchi

(10) Patent No.: US 7,359,193 B2
(45) Date of Patent: Apr. 15, 2008

(54) ELECTRONIC EQUIPMENT

(75) Inventor: Masaru Deguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 204 days.

(21) Appl. No.: 11/244,024

(22) Filed: Oct. 5, 2005

(65) Prior Publication Data

US 2006/0082967 A1  Apr. 20, 2006

(30) Foreign Application Priority Data

Oct. 20, 2004  (JP) ............................. 2004-305962

(51) Int. Cl.
*H05K 7/20* (2006.01)
(52) U.S. Cl. ....................... 361/695; 361/694; 454/184
(58) Field of Classification Search ................ 361/687, 361/694–695; 454/184
See application file for complete search history.

(56) References Cited

U.S. PATENT DOCUMENTS

| | | | |
|---|---|---|---|
| 4,399,485 A * | 8/1983 | Wright et al. ................ 361/693 |
| 5,398,161 A * | 3/1995 | Roy ............................ 361/727 |
| 6,317,319 B1 * | 11/2001 | Lewis et al. ................. 361/695 |
| 6,980,435 B2 * | 12/2005 | Shum et al. ................. 361/695 |
| 7,042,722 B2 * | 5/2006 | Suzuki et al. ............... 361/695 |

FOREIGN PATENT DOCUMENTS

JP  2002-237692  8/2002

* cited by examiner

*Primary Examiner*—Gregory D Thompson
(74) *Attorney, Agent, or Firm*—Scully, Scott, Murphy & Presser, P.C.

(57) ABSTRACT

Electronic equipment includes a chassis that compose a case, a first printed circuit board, an MPU and a memory both of which are mounted in the case and consume high power, and a cooling fan for taking in air from the outside into the inside of the case. The cooling fan supplies an air current to the MPU and the memory to cool them. The electronic equipment also includes a wind direction control board between the cooling fan and the MPU and the memory to partition the inside of the case into at least two subspaces. The wind direction control board has an opening at a position opposed to the MPU and the memory.

17 Claims, 5 Drawing Sheets

ELECTRONIC EQUIPMENT

FIELD OF THE INVENTION

The present invention relates to an electronic equipment, and more particularly to a technology for cooling components mounted in the electronic equipment.

BACKGROUND OF THE INVENTION

To ensure the stable operation of an electronic equipment such as a communication equipment, it is necessary to fully prevent components mounted in an electronic equipment from being overheated. In order to prevent components mounted in an electronic equipment from being overheated, a conventional electronic equipment has a cooling fan to supply a cooling air current into the electronic equipment.

However, high power consumption components, such as an MPU or a memory, tend to be overheated when cooled only by a cooling fan, as a result of which their operations will fail. Therefore, to ensure the stable operation of an electronic equipment, using only a cooling fan is not sufficient for cooling components mounted in the electronic equipment. To solve this problem, Patent Document 1 proposes a configuration in which a window direction board (also termed wind direction control boards) is provided inside an electronic equipment in such a way the space in the electronic equipment is partitioned by the window direction board and the air flow path is controlled to allow the air current to be supplied effectively to the high power consumption component in the electronic equipment.

[Patent Document 1]
  Japanese Patent Kokai Publication No. JP-P2002-237692A

SUMMARY OF THE DISCLOSURE

One of the problems with the method disclosed in Patent Document 1 is that, as components are mounted in an electronic equipment more densely, the complicated air current flow paths are required to cool high power consumption components arranged in various locations in the electronic equipment. This requirement complicates the layout of the wind direction boards and the components. In addition, when the components are mounted more densely and some of the components interfere with other pars, the layout becomes much more complicated.

Another problem is that a wind direction board of complicated shape or a plurality of separate wind direction boards of different shapes, if arranged in an electronic equipment, require more man-hour in manufacturing and arranging the wind direction boards. In addition, because each electronic equipment requires a dedicated wind direction board, the cost of the electronic equipment is increased.

In view of the foregoing, it is an object of the present invention to provide simple-layout, low-cost electronic equipment that sufficiently cools high power consumption components.

The above and other object are attained by an electronic equipment, in accordance with one aspect of the present invention, comprising: a chassis;
  at least one heating element provided in said chassis; and
  a cooling fan for taking in air from an outside of said chassis into said chassis to supply an air current for cooling said heating element;
  said electronic equipment further comprising a partitioning board, arranged between said cooling fan and said heating element, for partitioning the inside of said chassis into at least two subspaces, said partitioning board having an opening at a position opposed to said heating element.

An electronic equipment according to another aspect of the present invention comprises:
  at least one component mounted in a chassis, said component generating heat and requiring cooling during operation;
  a cooling fan; and
  a wind direction control board, arranged between said cooling fan and said component, for partitioning an inside of said chassis, said wind direction control board having an opening opposed to said component, said wind direction control board guiding an air current from said cooling fan to said opening through which the air current is supplied to said component.

Preferably, in the electronic equipment according to the present invention, the wind direction control board, arranged between said cooling fan and said component and protruding into a downstream side of said cooling fan, collects the air current supplied from said cooling fan and sends the collected air current directionally from said opening to said component.

Preferably, in the electronic equipment according to the present invention, the wind direction control board is made of a long rectangular flat plate, said wind direction control board, when installed in said chassis, is bent so that said wind direction control board protrudes into a downstream side of said cooling fan, and said opening is formed in a convex region of said wind direction control board.

Preferably, in the electronic equipment according to the present invention, the wind direction control board has at least one fold so that the opening is located close to the component and is opposed to the component.

The meritorious effects of the present invention are summarized as follows.

According to the electronic equipment of the present invention, when the electronic equipment is in operation, an air current supplied from the cooling fan to the partitioning board is sent from the opening, formed on the partitioning board, to the front of the opening swiftly and directionally. Therefore, the electronic equipment can efficiently supply the air current to a heating element positioned opposed to the opening and thus efficiently cools the heating element.

Because an air current is sent from the opening directionally, there is no need to partition the space along the flow path as in conventional electronic equipment and, in addition, a sufficient air current can be supplied to a heating element even if the partitioning board is provided away from the heating element. Therefore, this structure simplifies the configuration of the partitioning board and allows the partitioning board and the components to be laid out easily. This structure also reduces the manufacturing cost of electronic equipment.

In the present invention, the partitioning board, which is flexible, can be bent into a curved form so that a region, where the opening is formed is protruded into the side of the heating element. This structure simplifies the configuration of the partitioning board and therefore enhances the effect of the present invention. It is also possible to bend the partitioning board at an angle at one or more positions and to make a part, where the opening is formed, plane. The partitioning board with this configuration causes the air current to make a detour so that the air current is applied directly even to a component to which, because of other interfering components, the air current would not otherwise be applied sufficiently. Therefore, the high power consumption components can be cooled sufficiently.

In a preferred embodiment of the present invention, the partitioning board is made of a resin material. This material prevents a short circuit, which would be caused by a contact between a component mounted in the electronic equipment and the partitioning board, and ensures that the partitioning board is electrically safe even if the installation density is increased. Another advantage is that the resin material, which has good flexibility and plasticity, allows the partitioning board to be bent into a curved form or at an angle easily.

In the present invention, the cooling fan can be provided inside the chassis or at least a component of it can be provided outside the chassis. In the present invention, the partitioning board preferably has notches for storing interfering components or distribution cables in the electronic equipment. This allows the partitioning board or the components to be laid out more easily.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
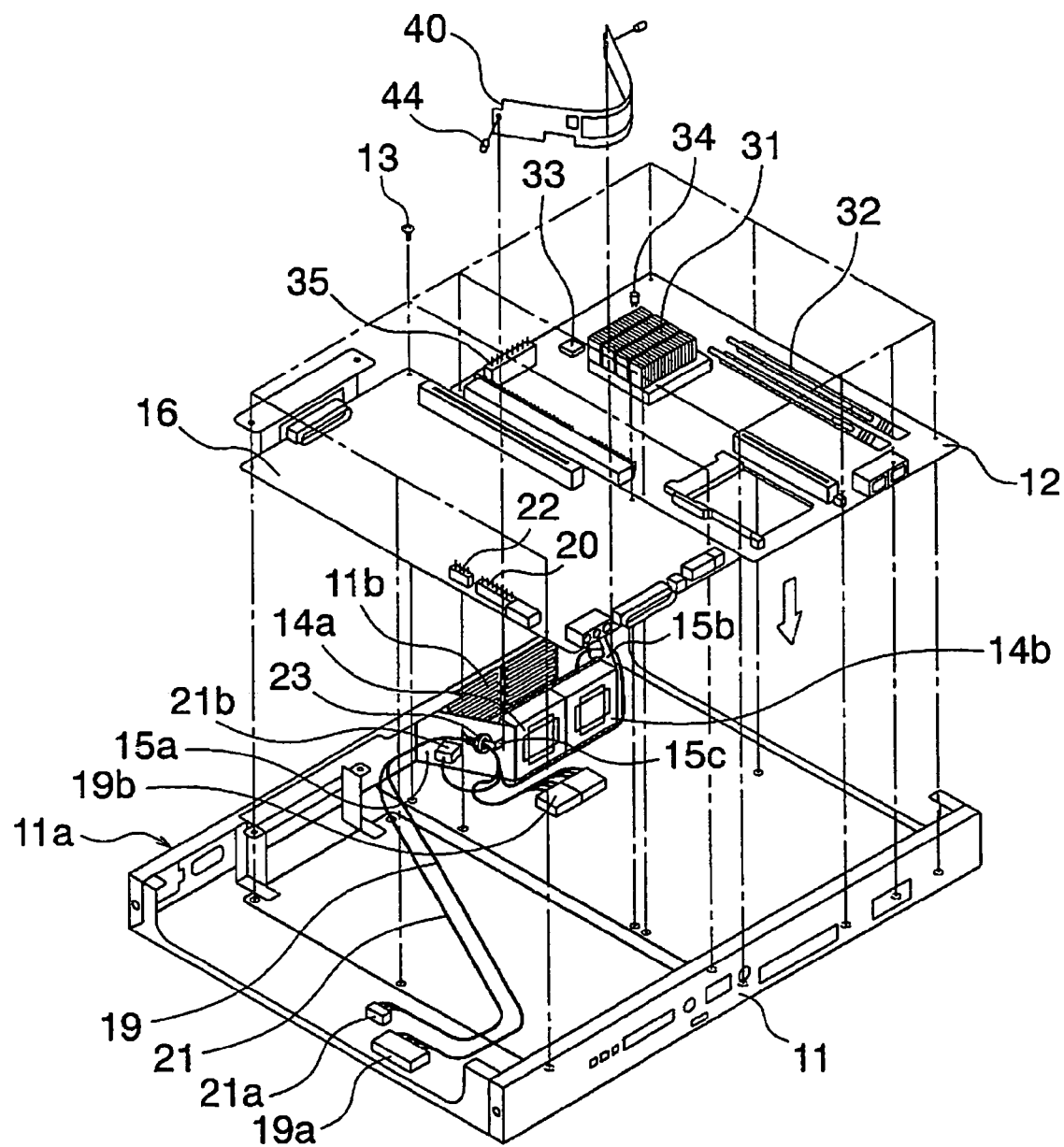
FIG. 1 is a perspective view showing an electronic equipment according to a first embodiment of the present invention with some components exploded.
Figure 2:
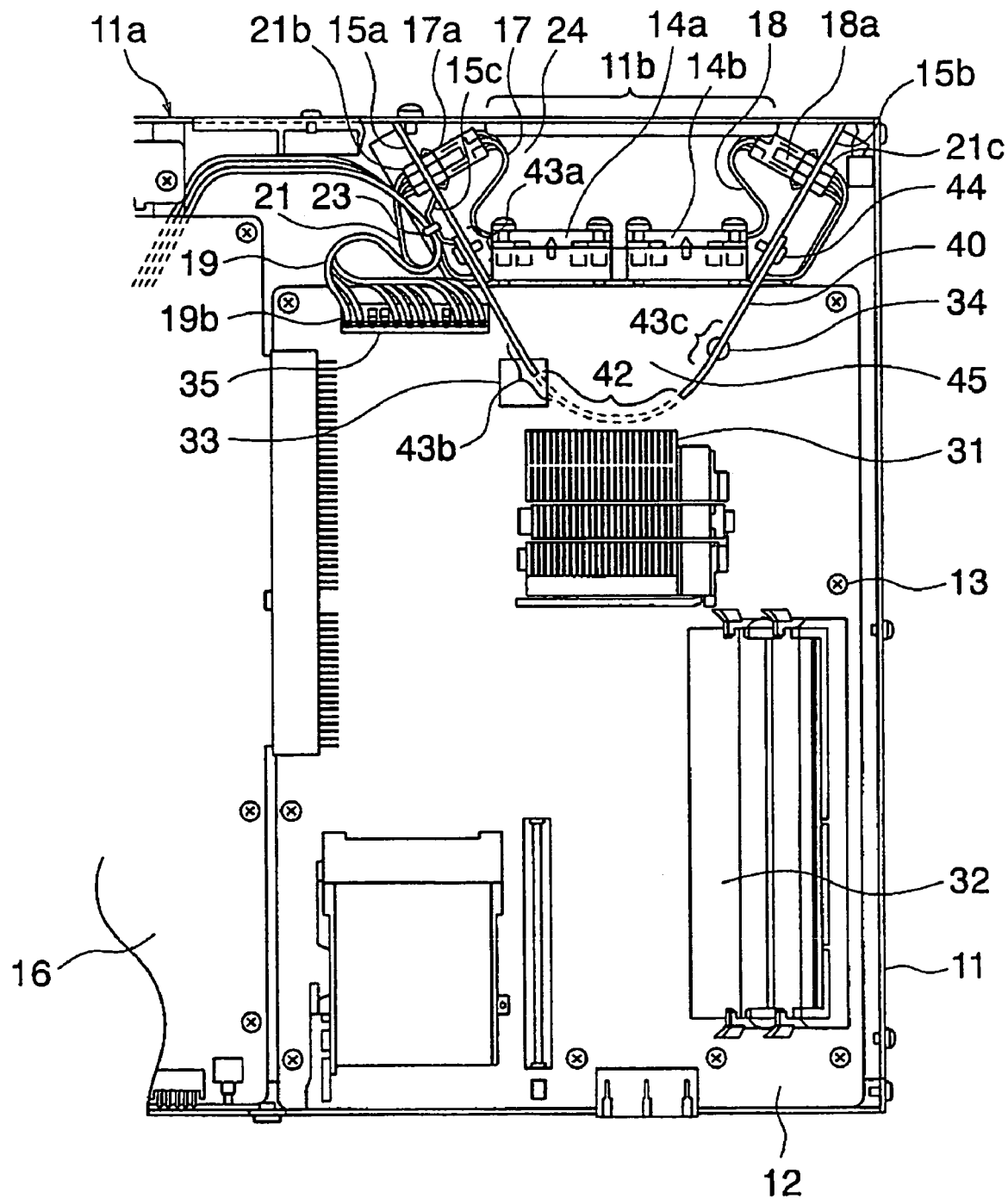
FIG. 2 is a top view showing the configuration of the electronic equipment according to the first embodiment of the present invention.

Embodiments of the present invention will be described below more in detail with reference to the drawings. FIG. 1 is a perspective view showing an electronic equipment according to a first embodiment of the present invention, illustrating some components in an expanded form. FIG. 2 is a top view showing the assembled state. An electronic equipment 10, comprises a chassis 11 that defines the external form of the electronic equipment 10 and that is an electronic equipment package mounted on a shelf not shown in parallel with other electronic equipment in the thickness direction thereof; a first printed circuit board 12 fixed to the chassis 11 with mounting screws 13; and a second printed circuit board 16 arranged next to the first printed circuit board 12.

On one side 11a of the chassis 11, an intake 11b is formed by cutting a part of the side 11a. Two cooling fans 14a and 14b are arranged inside the intake 11b in parallel to the side 11a. The cooling fans 14a and 14b can supply a cooling air current to the first printed circuit board 12.

Shields 15a and 15b, each made of a metal board, are provided by the side of the intake 11b. The shields 15a and 15b, the chassis 11, and the cases of the two cooling fans 14a and 14b form a closed space 24. The main units of the cooling fans 14a and 14b have their air intakes opened in the closed space 24 and have their air outlets opened toward a wind direction control board 40 that is outside the closed space 24. The shields 15a and 15b, which have L-shaped cross sections, have the bottoms of the L-shaped components fixed on the bottom of the chassis 11. The closed space 24 mentioned above allows external air to be taken effectively into the inside the electronic equipment 10.

A distribution cable 19 used as a power supply line of the first printed circuit board 12 and a distribution cable 21 used as a power supply line of the cooling fans 14a and 14b are provided in an area in the electronic equipment 10 that is separate from the closed space 24. The distribution cable 19 has a connector 19a on one end and a connector 19b on the other. The connector 19a is connected to a connector 20 on the second printed circuit board 16, and the connector 19b is connected to a connector 35 on the first printed circuit board 12. A distribution cable 21 has a connector 21a on one end, and connectors 21b and 21c on the other branch ends. The connector 21a is connected to a connector 22 on the second printed circuit board 16, and the connectors 21b and 21c are fixed on the shields 15a and 15b in such a way that their junctions are exposed in the closed space 24 at the openings, not shown, formed on the shields 15a and 15b.

A cable fixing unit 15c, a horseshoe-shaped unit formed by bending a long metal plate, is fixed in the top portion of the shield 15a to allow space between itself and the shield 15a. The distribution cable 19 and the distribution cable 21 are fixed on the cable fixing unit 15c using a ring-shaped fixing band 23.

Distribution cables 17 and 18 used as the power supply lines of the cooling fans 14a and 14b are provided in the closed space 24. One end of the distribution cables 17 and 18 is connected to the cooling fans 14a and 14b, respectively. The other end is connected to the connectors 21b and 21c, respectively, via connectors 17a and 18a.

An MPU 31, a memory 32, an LSI 33, a capacitor 34, the connector 35, and other components are mounted on the first printed circuit board 12. Of those components, the MPU 31 and the memory 32 are high power consumption components that require sufficient cooling. For efficient cooling, it is desirable that the high power consumption components be arranged close to the cooling fans 14a and 14b. However, because of restrictions on a mounting space of the first printed circuit board 12, the transmission waveform characteristics and the like, those components are arranged usually in the center of the first printed circuit board 12.

In the electronic equipment 10 according to the present embodiment, the wind direction control board 40 is provided near the cooling fans 14a and 14b. Beginning from regions near the respective junctions of the shields 15a and 15b and the cases of the cooling fans 14a and 14b, the wind direction control board 40 is flexibly bent to have a convex form protruding into the outside of the closed space 24, that is, protruding into a downstream side of the cooling fans 14a and 14b. The wind direction control board 40 is fixed at its both ends on the shields 15a and 15b. The wind direction control board 40 and the cases of the cooling fans 14a and 14b compose a partitioning board to form a closed space 45.

Figure 3:
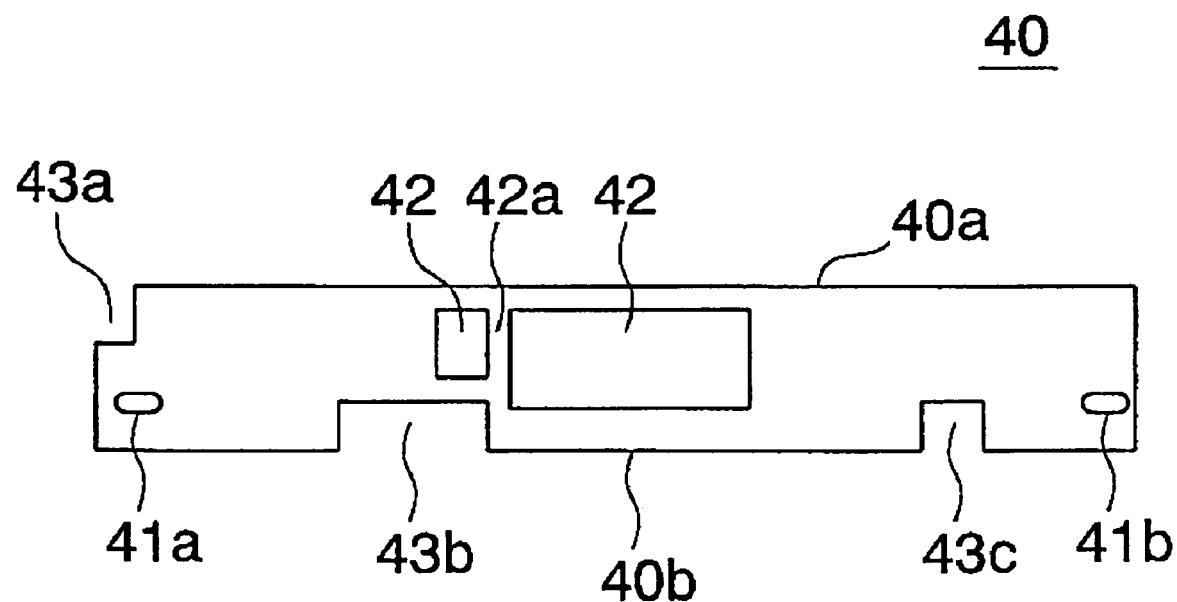
FIG. 3 is a top view showing the configuration of the wind direction control board shown in FIG. 1.

FIG. 3 is a plan view of the window direction control board. The wind direction control board 40, made of a highly flexible, thin plastic board, has the shape of a long rectangle. The wind direction control board 40 has a first screw hole 41a and a second screw hole 41b formed on both ends, an opening 42 formed in the center, a first notch 43a formed on a side 40a that is on the side far from the first printed circuit board 12, and a second notch 43b and a third notch 43c formed on a side 40b that is the side near to the first printed circuit board 12. The opening 42 is divided into two by a bridge 42a which is provided in order to maintain the strength of the wind direction control board 40 near the opening 42.

The opening 42 is opposed to the MPU 31 and the memory 32 when the wind direction control board 40 is fixed on the shields 15a and 15b. The opening 42 has a size to allow the air to be supplied at an appropriate speed. The first to third notches 43a, 43b, and 43c, provided where the wind direction control board 40 intersects with cable fixing unit 15c, LSI 33, and capacitor 34 respectively, are large enough to accommodate them.

When the electronic equipment 10 is used, the air current supplied from the cooling fans 14a and 14b to the closed space 45 is sent directionally and swiftly from the opening 42 to the front of the opening 42. This structure allows the air current to be applied efficiently to the MPU 31 and the memory 32, opposed to the opening 42, thus efficiently cooling the MPU 31 and the memory 32.

Unlike the conventional electronic equipment, the electronic equipment according to the present embodiment does not have airflow paths therein for partitioning the space. Instead, the electronic equipment according to the present embodiment has a wind direction control board that has an opening opposed to high power consumption components to efficiently cool them. The wind direction control board also has notches to avoid interference with other components on the printed circuit board such as components and distribution cables. These features of the wind direction control board allow the wind direction control board and components to be easily laid out.

In the electronic equipment according to the present embodiment, in which the wind direction control board is made of plastic, the opening and notches can be formed easily and therefore the wind direction control board can be manufactured at a low cost. The wind direction control board, if made of metal, tends to cause a short circuit as components are mounted more densely. In constant, the wind direction control board made of plastic in this embodiment prevents a short circuit between the components.

Figure 4:
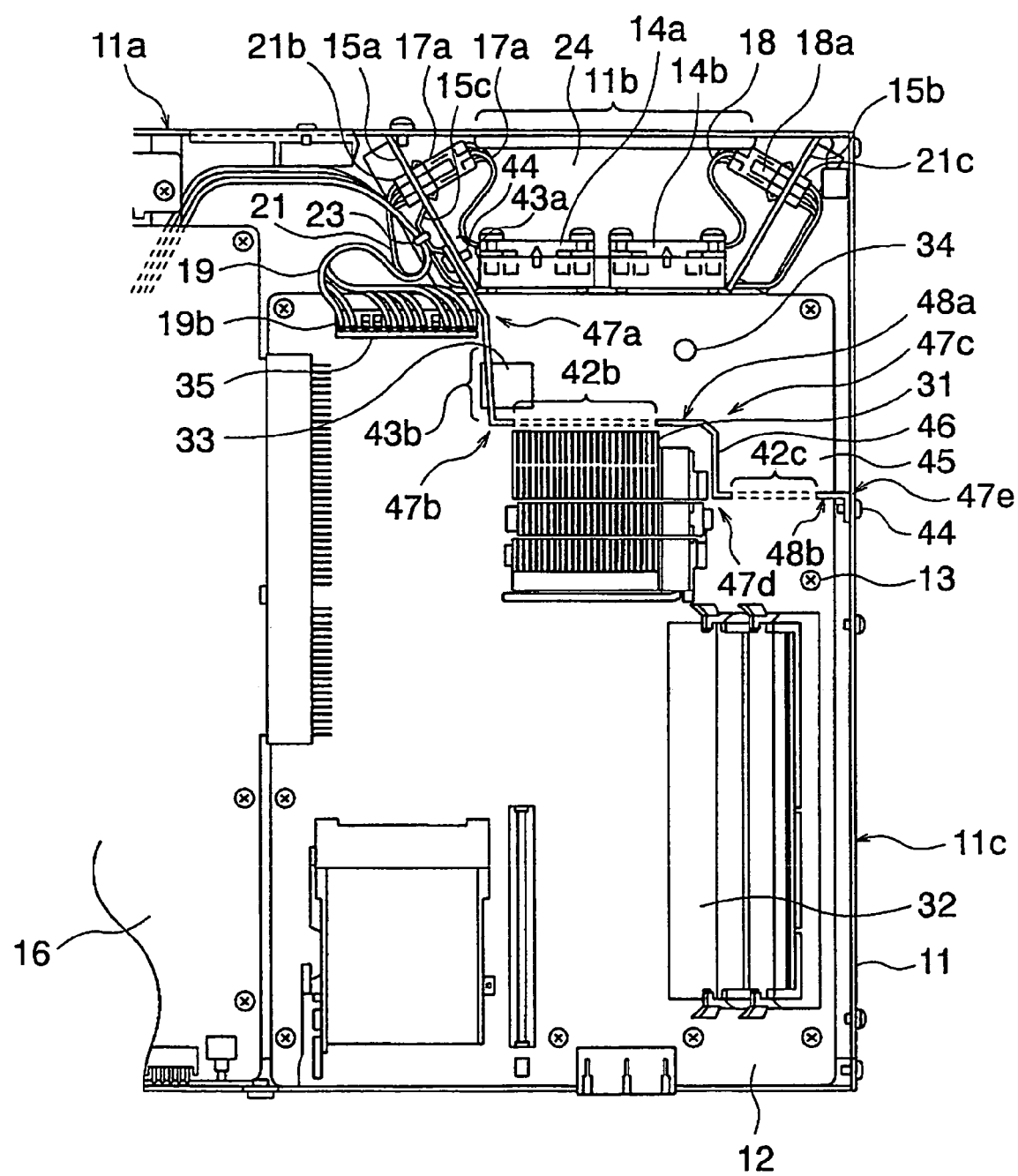
FIG. 4 is a top view showing the configuration of electronic equipment according to a second embodiment of the present invention.

FIG. 4 is a diagram showing the configuration of an electronic equipment according to a second embodiment of the present invention. An electronic equipment 36 according to the present embodiment is almost similar to the electronic equipment 10 according to the first embodiment except the configuration of a wind direction control board 46.

Figure 5:
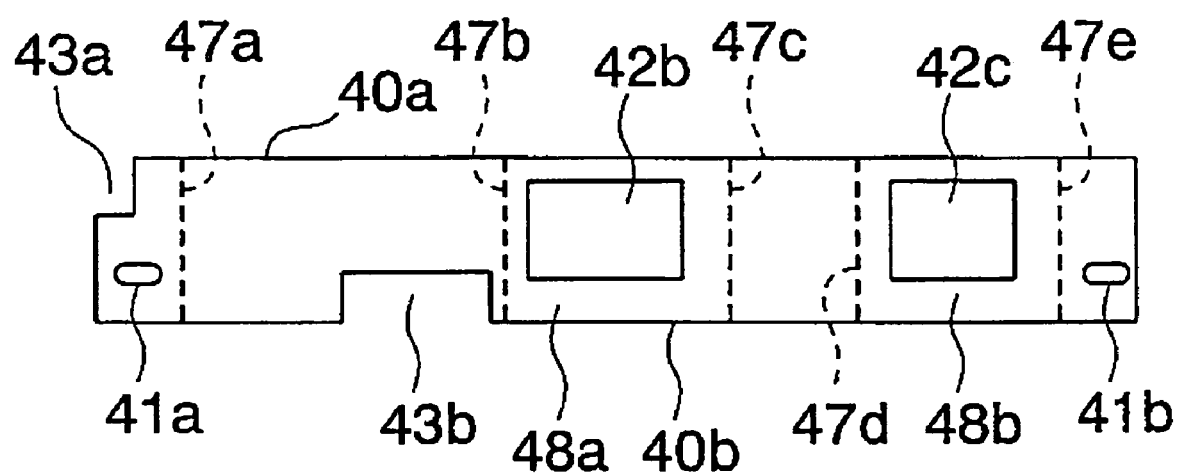
FIG. 5 is a top view showing the configuration of the wind direction control board shown in FIG. 4.

FIG. 5 shows the plan view of the wind direction control board shown in FIG. 4. As shown in FIG. 5, the wind direction control board 46 has a plurality of folds 47a, 47b, 47c, 47d, and 47e that are formed along the shorter side. A first opening 42b is formed in a first face 48a that is put between the folds 47b and 47c, and a second opening 42c is formed in a second face 48b that is put between the folds 47d and 47e. The wind direction control board 46 has not a third notch 43c. The wind direction control board 46 according to the present embodiment has a configuration similar to that of the wind direction control board 40 according to the first embodiment except the folds and the third notch described above.

Returning to FIG. 4, the wind direction control board 46 are bent at the plurality of folds 47a, 47b, 47c, 47d, and 47e with predetermine angles respectively. The first face 48a and the second face 48b are located close to, and opposed to, the MPU 31 and the memory 32, respectively. As in the first embodiment, one end of the wind direction control board 46 is fixed on a shield 15a with the other end fixed on a side 11c of the chassis 11. The wind direction control board 40, the cases of the cooling fans 14a and 14b, and the shield 15b configure partitioning boards to form a closed space 45.

In the electronic equipment 36, the wind direction control board 46 with the shape described above causes some of the air current to be supplied from the first opening 42b to the MPU 31 located in front of the opening. Some other air current makes a detour toward the memory 32 to supply the air current from the second opening 42c, formed near the memory 32, to the memory 32 located in front of that opening.

With the electronic equipment according to the present embodiment, the wind direction control board has a plurality of folds and is bent so that the openings are located near, and opposed to, the high power consumption components. This structure enables the air current to be made detour so that the air current is applied directly even to a component to which, because of other interfering components, the air current would not otherwise be applied sufficiently. Therefore, the high power consumption components can be cooled sufficiently.

According to the present invention, the wind direction control board can be not only a plastic board as described in the embodiments but also a metal board. To fasten the wind direction control board, not only screws but also various methods such as rivets, adhesive, and welding may be used depending upon the material of the wind direction control board. The cooling fans need not always be installed inside electronic equipment but may be installed outside the intake independently of the electronic equipment.

Although the present invention has been described with reference to the embodiments thereof, it is to be understood that the electronic equipment of the present invention is not limited to the configurations described above but electronic equipment configured by modifying or changing the above embodiments is also included in the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An electronic equipment comprising:
   a chassis;
   at least one heating element provided in said chassis;
   a cooling fan for taking in air from an outside of said chassis into said chassis to supply an air current for cooling said heating element; and
   a partitioning board, arranged between said cooling fan and said heating element, said partitioning board having an opening at a position opposed to said heating element, wherein said partitioning board is formed to have a part, in which said opening is formed, protruding toward said heating element to guide an air current from said cooling fan to said opening through which the air current is supplied to said heating element.

2. The electronic equipment according to claim 1, wherein said partitioning board, which is flexible, is bent and curved such that the part, in which said opening is formed, is a convex part.

3. The electronic equipment according to claim 1, wherein said partitioning board is formed such that the part, in which said opening is formed, is flat.

4. The electronic equipment according to claim 1, wherein said partitioning board is made of a resin material.

5. The electronic equipment according to claim 1, wherein said cooling fan is provided inside said chassis.

6. The electronic equipment according to claim 1, wherein said cooling fan is provided outside said chassis.

7. The electronic equipment according to claim 1, wherein said heating element is a component mounted in said chassis and generating heat during operation.

8. An electronic equipment comprising:
at least one component mounted in a chassis, said component generating heat and requiring cooling during operation;
a cooling fan; and
a wind direction control board, arranged between said cooling fan and said component, said wind direction control board having an opening opposed to said component, said wind direction control board is formed to have a part, in which said opening is formed, protruding toward said component for guiding an air current from said cooling fan to said opening through which the air current is supplied to said component.

9. The electronic equipment according to claim 8, wherein said wind direction control board is made of a long rectangular flat plate, and said wind direction control board, when installed in said chassis, is bent such that the part, in which said opening is formed, is a convex part.

10. The electronic equipment according to claim 9, wherein one or both ends of a longitudinal direction of said wind direction control board are attached on associated shields which are fixed to said chassis near said cooling fan.

11. The electronic equipment according to claim 9, wherein said wind direction control board has at least one notch on a side facing a circuit board.

12. The electronic equipment according to claim 9, wherein the opening of said wind direction control board is divided by a bridge.

13. The electronic equipment according to claim 8, wherein said wind direction control board has at least one fold so that said opening is located close to said component and is opposed to said component.

14. The electronic equipment according to claim 13, wherein said wind direction control board is bent to allow an air current to be applied directly to said component via said opening.

15. The electronic equipment according to claim 13, wherein one end of said wind direction control board is fixed to a side wall of said chassis.

16. The electronic equipment according to claim 8, wherein said wind direction control board is made of resin.

17. The electronic equipment according to claim 8, wherein said wind direction control board is made of a metal plate.

* * * * *